(12) United States Patent
Lehmann et al.

(10) Patent No.: US 7,436,721 B2
(45) Date of Patent: Oct. 14, 2008

(54) SUPPLYING VOLTAGE TO A BIT LINE OF A MEMORY DEVICE

(75) Inventors: Gunther Lehmann, Holzkirchen (DE); Yannick Martelloni, München (DE); Devesh Dwivedi, Bangalore (IN); Siddharth Gupta, Bangalore (IN)

(73) Assignee: Infineon Technologies AG, Munich (DE)

( * ) Notice: Subject to any disclaimer, the term of this patent is extended or adjusted under 35 U.S.C. 154(b) by 143 days.

(21) Appl. No.: 11/528,079

(22) Filed: Sep. 26, 2006

(65) Prior Publication Data
US 2007/0121400 A1    May 31, 2007

(30) Foreign Application Priority Data
Sep. 26, 2005  (DE) .................. 10 2005 045 952

(51) Int. Cl.
*G11C 7/00* (2006.01)
(52) U.S. Cl. .................. 365/203; 365/189.08; 365/204
(58) Field of Classification Search ................ 365/203, 365/204, 189.02, 189.07, 189.03, 189.08
See application file for complete search history.

(56) References Cited

U.S. PATENT DOCUMENTS

| | | | | |
|---|---|---|---|---|
| 6,829,171 B2 * | 12/2004 | Ooishi | ................. | 365/185.21 |
| 2008/0031054 A1 * | 2/2008 | Lehmann et al. | ....... | 365/189.02 |

FOREIGN PATENT DOCUMENTS

EP    0 434 104    6/1991

* cited by examiner

*Primary Examiner*—Son Dinh
*Assistant Examiner*—Hien N Nguyen
(74) *Attorney, Agent, or Firm*—Dicke, Billig & Czaja, PLLC (57) ABSTRACT

A method supplies voltage to a bit line of a memory device. The method includes precharging, with a precharging device, the bit line to an output potential, deactivating the precharging device during a read action related to the bit line, reading, during the read action, an information via the bit line, and routing, during the read action, a virtual voltage supply line to a supply potential of the memory device to supply voltage to memory cells of the memory device assigned to the bit line. The precharging device of the bit line is activated/deactivated as a function of the potential of the virtual voltage supply line.

25 Claims, 6 Drawing Sheets

SUPPLYING VOLTAGE TO A BIT LINE OF A MEMORY DEVICE

CROSS-REFERENCE TO RELATED APPLICATIONS

This Utility Patent Application claims priority to German Patent Application No. DE 10 2005 045 952.8, filed on Sep. 26, 2005, which is incorporated herein by reference.

BACKGROUND

Figure 1:
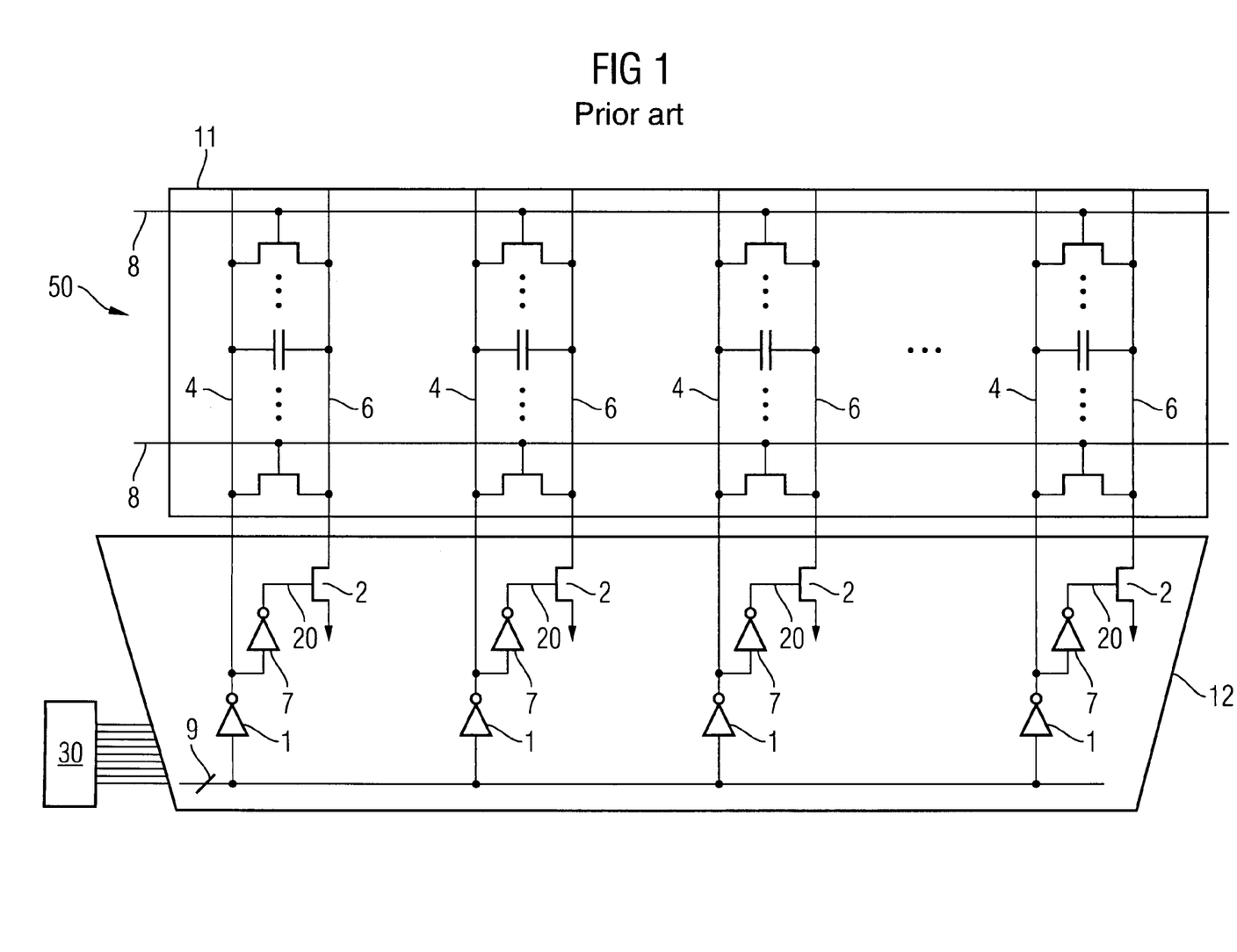
FIG. 1 illustrates a conventional memory device.

FIG. 1 illustrates a conventional Read-Only Memory (ROM) 50. During a read action, a column multiplexer 12 is actuated by way of a control device 30 such that on one hand a virtual voltage supply line 4 assigned to the corresponding column is charged to $V_{DD}$ and on the other a bit line 6 assigned to the corresponding column is no longer connected to $V_{SS}$. Accordingly, to do this an input of a corresponding charging device or of an inverter 1 is set from 1 to 0. As a result, virtual voltage supply line 4 connected to the output is charged to $V_{DD}$ and a connection between bit line 6 and $V_{SS}$ is simultaneously interrupted via a precharging device or an inverter 7 and an NFET transistor 2. If corresponding word line 8 is then activated, information from a memory cell of memory device 50, which is defined by the column selected and word line 8, is read out by way of bit line 6.

A virtual voltage supply line is understood here to be a line that supplies memory cells with voltage. Since only the memory cell or memory cells which are directly involved in a read action (or write action) have to be supplied with voltage, the voltage supply of the memory cells is frequently capable of being switched (off) for energy-saving reasons. This means that only those voltage supply lines that supply voltage to the memory cell(s) which are directly involved in a read action (or write action) (e.g., all memory cells of a column in memory device 50) are switched on, while all other voltage supply lines are switched off. These switchable voltage supply lines are termed virtual voltage supply lines.

Figure 5A:
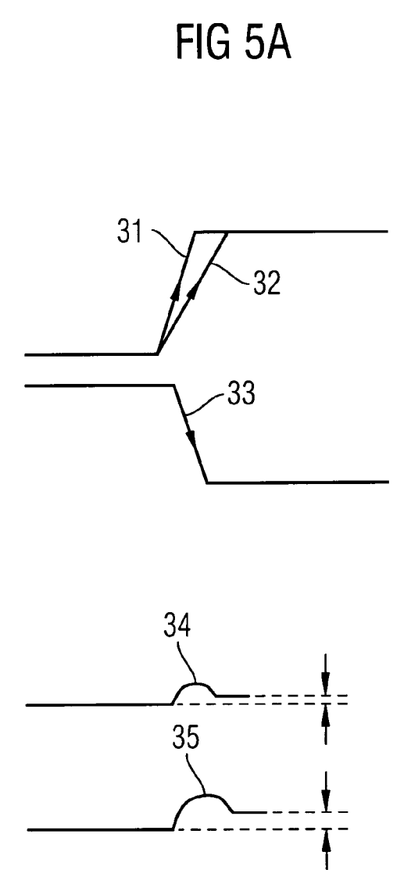
FIG. 5A illustrates example potential curves according to conventional memory devices.

Since conventionally charging of virtual voltage supply line 4 and disconnection of bit line 6 from $V_{SS}$ takes place almost simultaneously, the stray electric coupling (also referred to as cross coupling) between virtual voltage supply line 4 and bit line 6 leads to bit line 6 being drawn towards potential $V_{DD}$ to which virtual voltage supply line 4 is charged. In other words, switching of the memory cells' voltage supply leads to an undesirable potential change in bit line 6 due to the electric coupling. FIG. 5A illustrates a potential curve of virtual voltage supply line 4 and bit line 6 for the conventional memory device of FIG. 1. A potential curve of a short virtual voltage supply line 4 is indicated at 31. A potential curve of a comparatively long virtual voltage supply line 4 is indicated at 32. As illustrated by a potential curve 33 of a bit line precharging signal, which corresponds to an output signal 20 of inverter 7, the potential curve of this bit line precharging signal is independent of whether bit line 6 is long or short or whether it is coupled to a long or short virtual voltage supply line 4. Thus, the potential of bit line 6 is likewise drawn to $V_{DD}$ by charging of virtual voltage supply line 4 to $V_{DD}$, whereby this effect occurs more strongly with a long bit line 6 if the electric coupling between the bit line and virtual voltage supply line 4 is greater than is the case with a short bit line 6. This is also illustrated in FIG. 5Aa by a potential curve 34 for a short bit line 6 and potential curve 35 for a long bit line 6. In other words, the conventional time control of the deactivation of the bit line's precharging device is typically independent of the memory device's dimensions.

For these and other reasons, there is a need for the present invention.

SUMMARY

One embodiment provides a method of supplying voltage to a bit line of a memory device. The method includes precharging, with a precharging device, the bit line to an output potential, deactivating the precharging device during a read action related to the bit line, reading, during the read action, an information via the bit line, and routing, during the read action, a virtual voltage supply line to a supply potential of the memory device to supply voltage to memory cells of the memory device assigned to the bit line. The precharging device of the bit line is activated/deactivated as a function of the potential of the virtual voltage supply line.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments relate to a method of supplying voltage to a bit line of a memory device and an accordingly designed memory device in order to reduce negative effects due to an electric coupling between a bit line and a virtual voltage supply line.

Embodiments provide a method and/or a device wherein the negative effects of an electric coupling between the virtual voltage supply line and the bit line of a memory device are reduced compared to conventional memory devices.

One embodiment of a method supplies voltage to a bit line of a memory device. A precharging device, with which the bit line is precharged to an output potential, is controlled during a read action, which relates to or evaluates this bit line, as a function of the potential of a virtual voltage supply line (i.e., it is deactivated and also activated). During the read action, the virtual voltage supply line is routed to a supply potential of the memory device in order to supply the memory device's memory cells, which are assigned to the bit line, with the supply voltage.

In one embodiment, as the precharging device is deactivated or switched off depending on the potential of the virtual voltage supply line, with the result that the bit line is no longer precharged to the output potential, it is advantageous if deactivation of the precharging device does not take place until the virtual voltage supply line already has a predetermined potential. While the supply potential is being assigned to the virtual voltage supply line as a result of the existing electric coupling between the virtual voltage supply line and the bit line, this prevents a potential change in the virtual voltage supply line from affecting the bit line's potential as greatly as is the case in conventional memory devices. In other words, deactivation of the bit line's precharging device in this embodiment does not take place until the potential of the virtual voltage supply line corresponding to the bit line has already risen significantly, so that a further increase in the potential only leads to a slight negative effect on the bit line's potential.

In one embodiment, activation and also, above all, deactivation of the bit line's precharging device may also take place as a function of an intensity of an electric coupling between the bit line and the virtual voltage supply line. In this embodiment, the greater the intensity of the electric coupling between the bit line and the virtual voltage supply line, the later deactivation takes place.

As a result in one embodiment it is possible advantageously to take into account geometric structures of the memory device (e.g., the length of the virtual voltage supply line and bit line disposed in parallel) in deactivation of the precharging device. The larger the memory device or the longer the virtual voltage supply line and the bit line, the later after commencement of charging of the virtual voltage supply line, the bit line's precharging device should be deactivated with the result that the virtual voltage supply line has already almost completely reached its target potential aimed at as a result of charging, when precharging of the bit line is switched off so that a further change in the potential of the virtual voltage supply line (due to precharging) can no longer have as great an effect on the bit line's potential. The reason for this is, the longer the length of the virtual voltage supply line and thus the length of the bit line, the greater is the intensity of the electric coupling between the virtual voltage supply line and the bit line.

In particular, in one embodiment, the bit line's precharging device is not deactivated until a difference between the supply potential and the potential of the virtual voltage supply line has dropped in respect of its amount to below a predetermined value.

In one embodiment, as the virtual voltage supply line is charged to the supply potential during the read action, it is possible to correspondingly limit a potential change in the virtual voltage supply line after deactivation of the bit line's precharging device by correspondingly specifying the predetermined value. As a result, in one embodiment, the negative effects of the virtual voltage supply line's potential change, which occur due to the electric coupling between the virtual voltage supply line and the bit line, are also correspondingly limited in an advantageous manner.

In one embodiment, it is also possible that activation and deactivation of the bit line's precharging device additionally takes place as a function of the potential of a special virtual voltage supply line or of a virtual reference voltage supply line. In this embodiment, this virtual reference voltage supply line is routed or charged to the memory device's supply potential prior to the read action. At the same time, the bit line's precharging device is not deactivated until both the difference between the supply potential and the virtual voltage supply line's potential has fallen below the predetermined value in respect of its amount and also until a difference between the supply potential and the virtual reference voltage supply line's potential has dropped below a further predetermined value.

In one embodiment, as deactivation of the precharging device takes place when the virtual reference voltage supply line's potential assumes or exceeds a specific value at the earliest, it is advantageous to install a type of sequential safety buffer which ensures that deactivation of the precharging device does not take place too soon with the result that negative effects due to the potential change in the virtual voltage supply line in respect of the bit line can be reduced with even greater certainty.

One embodiment of a memory device having several memory cells, bit lines and virtual voltage supply lines also comprises a charging device to charge one of the virtual voltage supply lines to a supply potential of the memory device and a precharging device to charge one of the bit lines to an output potential of the memory device. In this embodiment, actuation of the charging device and of the precharging device is carried out by a control device of the memory device. At the same time, the charging device at one end of one of the virtual voltage supply lines and the precharging device at the other end of the same virtual voltage supply line are connected to this virtual voltage supply line.

In one embodiment, as the charging device and the precharging device are connected to different ends of the same virtual voltage supply line, it is possible to use the potential of this virtual voltage supply line to activate and deactivate the precharging device. To do this, the virtual voltage supply line, proceeding from an output potential of the memory device, is drawn by the charging device to the memory device's supply potential during the read action. As the precharging device is connected at the other end of the same virtual voltage supply line as the charging device, a potential change of the virtual voltage supply line does not have an effect on the precharging device until the potential change is transferred to the entire virtual voltage supply line. Since the stronger this electric coupling is, the more the electric coupling between the virtual voltage supply line and the bit line slows down this potential change, the more intense the electric coupling between the virtual voltage supply line and the bit line and the later also is the effect of the virtual voltage supply line's potential change on the precharging device. In one embodiment, if deactivation of the precharging device takes place as a function of the virtual voltage supply line's potential change, then the more intense the electric coupling between the virtual voltage supply line and the bit line and the later the precharging device for the bit line is correspondingly deactivated.

Embodiments are preferably suitable for use in memory devices in which a supply voltage of memory cells is switched. In addition to ROMs this also includes Random Access Memories (RAMs), such as magnetic RAMs (MRAMs) and Ferroelectric RAMs (FeRAMS). Embodiments are also capable for use in Flash memories. As embodiments enable automatic adaptation to the size of the relevant memory device, embodiments are also particularly suitable for memory devices embedded in semiconductor circuits because there is no need for a complex calculation and adaptive supplementary circuits to prevent the negative effect of the voltage supply line's potential change on the bit line.

Since, according to embodiments, the negative stray effect of the bit line is reduced by comparison with the prior art, it is possible in embodiments to lower requirements on the read action, with the result that it is possible to reduce a time interval between activation of the word line and evaluation of the bit line by comparison with the prior art, which leads to a shorter memory access time.

Figure 2:
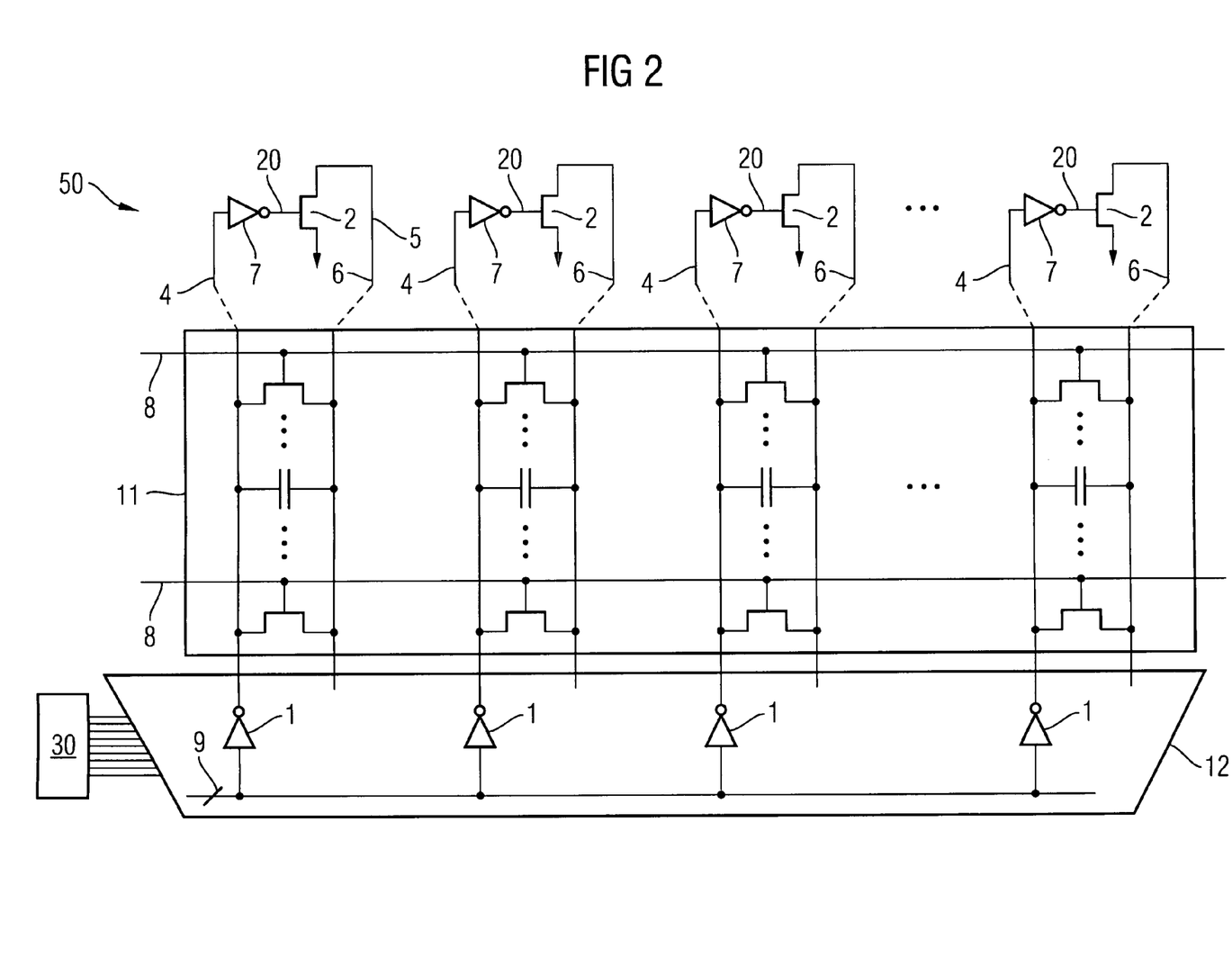
FIG. 2 illustrates one embodiment of a memory device.

FIG. 2 illustrates one first embodiment of a memory device 50. In addition to a control device 30, memory device 50 comprises a ROM array 11 and a column multiplexer 12. One of a plurality of virtual voltage supply lines 4 is precharged in each case to $V_{DD}$ by an inverter 1 when a column of the memory device corresponding to virtual voltage supply line 4 is selected via control device 30 during a read action. In this case each virtual voltage supply line 4 is connected to an output of the corresponding first inverter 1 and to an input of a second inverter 7 corresponding to the column. The output of inverter 7 is connected to a control connector of an NFET transistor 2 assigned to the corresponding column. $V_{SS}$ is connected to a bit line 6 corresponding to a column by way of NFET transistor 2 as a result of which the NFET transistor 2 precharges bit line 6 to $V_{SS}$ or holds it there when the corresponding column is not involved in a read action.

When a specific column is involved in a read action (i.e., a memory cell of this column is to be read) control device 30 sets the input of corresponding inverter 1 to the value 0 or $V_{SS}$. As a result of this the output of inverter 1 assumes the value 1 or $V_{DD}$, as a result of which virtual voltage supply line 4 linked to the output of inverter 1 is charged to $V_{DD}$. As second inverter 7 is connected on the input side to the other end of virtual voltage supply line 4 as the output of first inverter 1, the value at the input of second inverter 7 depends on the signal's propagation delay by way of virtual voltage supply line 4 and on the potential curve by way of virtual voltage supply line 4 and thus also on the coupling capacity (electric coupling) between virtual voltage supply line 4 and associated bit line 6. When $V_{DD}$ is present at the input of second inverter 7, $V_{SS}$ is present at the output of second inverter 7, as a result of which NFET transistor 2 disconnects. As a result, bit line 6 is no longer connected to $V_{SS}$ in order to be able to assume a value which corresponds to an information of the memory cell to be read out by the read action, the memory cell being addressed by way of one of word lines 8.

As the input of second inverter 7 is connected to the other end of virtual voltage supply line 4 as the output of first inverter 1, in one embodiment it is advantageously ensured that NFET transistor 2 (charging device of bit line 6) does not disconnect until the potential of virtual voltage supply line 4 is already close to $V_{DD}$. This ensures that bit line 6 is kept at $V_{SS}$ by way of the NFET transistor 2 during the critical phase of the potential change of virtual voltage supply line 4 with the result that the electric coupling between virtual voltage supply line 4 and bit line 6 cannot change the potential of bit line 6 towards $V_{DD}$ during this critical phase.

On embodiment of memory device 50 has a self-adapting or self-adjusting property. The longer are virtual voltage supply line 4 and bit line 6, which run parallel, the greater the intensity of the electric coupling between virtual voltage supply line 4 and bit line 6. Since, however, the longer is virtual voltage supply line 4 and the more intense is the electric coupling between virtual voltage supply line 4 and bit line 6, starting from the commencement of precharging of virtual voltage supply line 4 to $V_{DD}$, the later deactivation of NFET transistor 2 takes place. In this case, the critical phase of the potential change of virtual voltage supply line 4 is already over when bit line 6 is disconnected from $V_{SS}$ via NFET transistor 2. In a similar manner, the shorter is virtual voltage supply line 4 and thus also bit line 6, the earlier deactivation of NFET transistor 2 takes place. In other words, deactivation of NFET transistor 2 takes place earlier with a short bit line 6 and thus short virtual voltage supply line 4 than with a long bit line 6 but still late enough to prevent the negative effects of the electric coupling between virtual voltage supply line 4 and bit line 6.

This self-adjusting effect of this embodiment is very significant for memory compilers which automatically generate memory devices with different sizes as these memory compilers have to attenuate the otherwise disadvantageous effect of the length of virtual voltage supply line 4 by means of additional measures. Furthermore, due to the construction according to embodiments of memory device 50, any process variations possibly occurring, which alter the coupling capacity between virtual voltage supply line 4 and bit line 6, are taken into account automatically. For example, a larger coupling capacity leads to NFET transistor 2 remaining activated for a longer time and thus keeps bit line 6 at $V_{SS}$.

Figure 3:
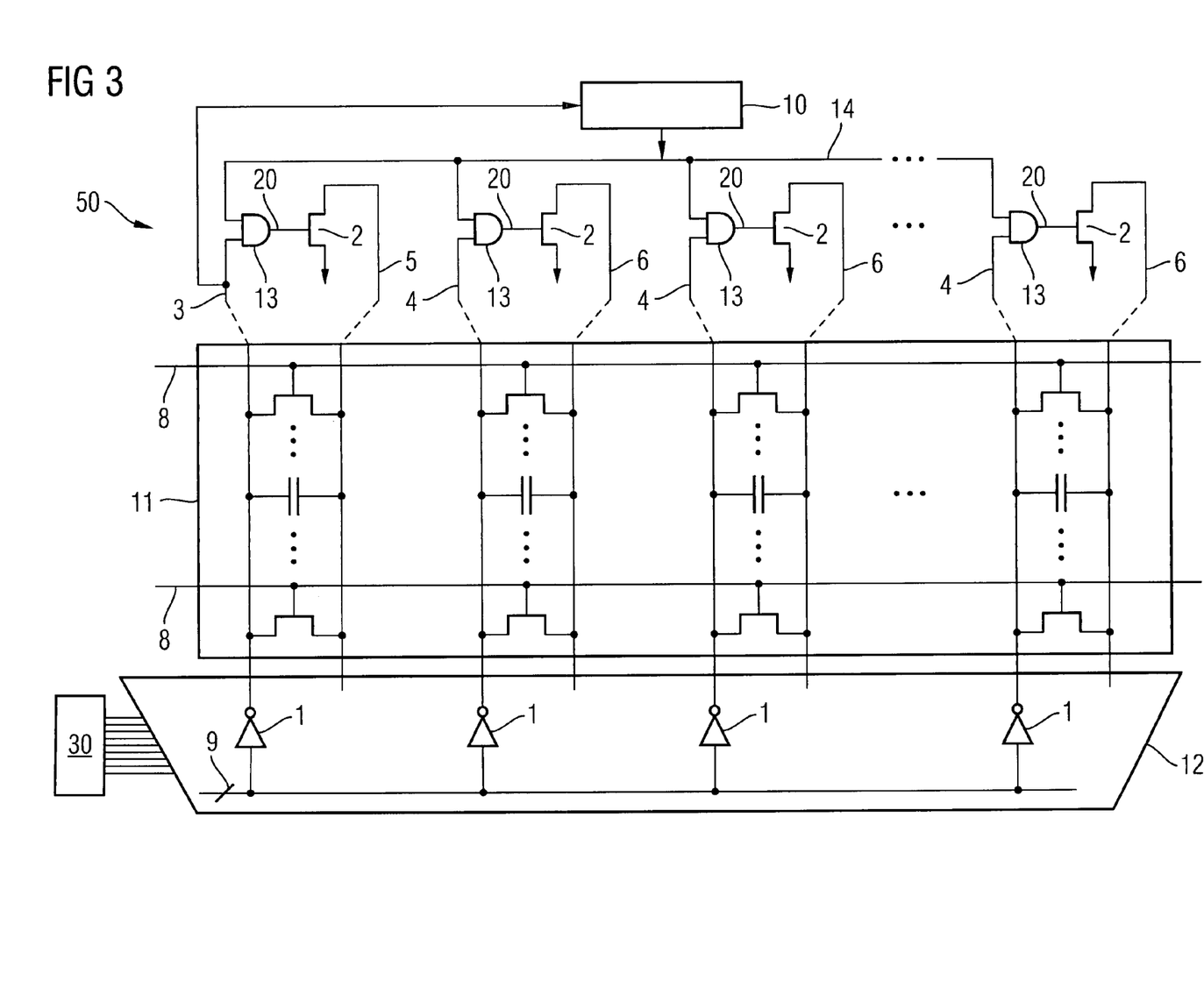
FIG. 3 illustrates one embodiment of a memory device.

FIG. 3 illustrates another embodiment of a memory device 50. In the following the differences between memory device 50 illustrated in FIG. 3 will be explained by comparison with memory device 50 illustrated in FIG. 2. In addition to virtual voltage supply lines 4, memory device 50 illustrated in FIG. 3 has a virtual reference voltage supply line 3 and a reference bit line 5 in addition to bit lines 6. In this case, precharging of both virtual reference voltage supply line 3 and also of reference bit line 5 takes place in just the same way as precharging of any virtual voltage supply line 4 or bit line 6. The memory cells within the column, which is called the reference column, in which virtual reference voltage supply line 3 and reference bit line 5 are disposed, possess memory values selected such that an electric coupling between virtual reference voltage supply line 3 and reference bit line 5 is at a maximum. In other words, under otherwise the same boundary conditions there is no memory assignment of the reference column which would lead to a more intense electric coupling between virtual reference voltage supply line 3 and reference bit line 5.

In the embodiment illustrated in FIG. 3, control device 30 is designed such that on each read action both the input of first inverter 1 of the column to be read and also the input of first inverter 1 of the reference column is loaded with the value 0.

In the embodiments of FIG. 3, second inverter 7 from the embodiment of FIG. 2 is replaced by a NAND gate 13. In this case, one input of NAND gate 13 is connected to corresponding virtual voltage supply line 4 and the other input is connected to virtual reference voltage supply line 3 by way of a delay device 10. The output of NAND gate 13 is connected to the control input of NFET transistor 2 by way of signal 20. NAND gate 13 is in every column as only the NFET transistor 2, whose column is involved in the read action, may be deactivated while all other NFET transistors 2, with the exception of NFET transistor 2 of the reference column, continue to keep their bit line 6 at $V_{SS}$.

Thus, in the embodiment of FIG. 3, NFET transistor 2 does not disconnect in a specific column until both corresponding virtual voltage supply line 4 has assumed the value 1 and also virtual reference voltage supply line 3 has assumed the value 1 for some time which is determined by delay device 10. As the memory assignment of the reference column is designed such that the coupling activity between virtual reference voltage supply line 3 and reference bit line 5 is at a maximum, coupling of the disconnection of NFET transistor 2 with virtual reference voltage supply line 3 represents a type of worst case timing as a result of which timing of the deactivation of precharging of corresponding bit line 6 is independent of the memory assignment of the corresponding column. As the length of virtual reference voltage supply line 3 and of reference bit line 5 matches the length of other virtual voltage supply lines 4 and bit lines 6, the embodiment illustrated in FIG. 3 also possesses the self-adjusting effect already mentioned previously.

Figure 4:
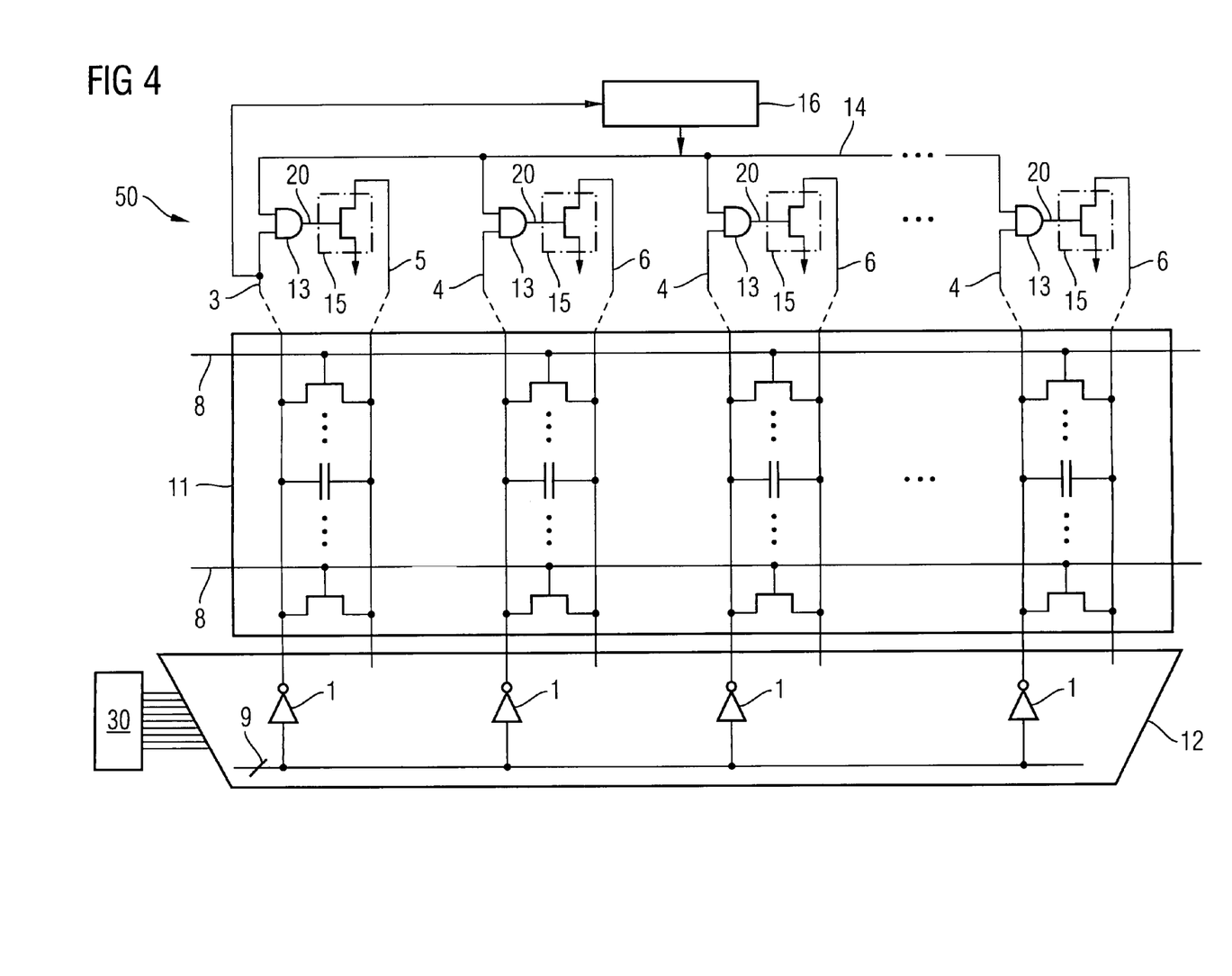
FIG. 4 illustrates one embodiment of a memory device.

FIG. 4 illustrates another embodiment of a memory device 50. The embodiment illustrated in FIG. 4 has a programmable precharging device 15 instead of NFET transistor 2 and a programmable delay device 16 instead of delay device 10. Thus, with the embodiment illustrated in FIG. 4, it is possible to set the delay between virtual reference voltage supply line 3 and NAND gate 13 or programmable precharging device 15 as a result of which adjustments may be made in turn to the time control of memory device 50.

Furthermore, it is possible with programmable precharging devices 15 to modify the size of precharging device 15 and thus of the current which flows through precharging device 15 on precharging. Thus, it is also possible to adapt the precharging device to the conditions of a special memory device 50. As a rule, the longer virtual voltage supply line 4 and bit line 6, the larger the precharging device selected. As a result it is possible that, especially with short bit lines 6, an area requirement for precharging device 15 can be reduced and also current peaks can be prevented compared with the case where precharging device 15 cannot be adapted.

An embodiment (not illustrated) is also possible in which the supply potential is $V_{SS}$ with the result that control device 30 precharges corresponding virtual voltage supply line 4 while corresponding first inverter 1 is actuated on the input side with the value 1. In this case NFET transistor 2 is replaced by a PFET transistor, and NAND gate 13 by a NOR gate. Bit lines 6 are precharged to $V_{DD}$ by way of the respective PFET transistor in each case.

Figure 5B:
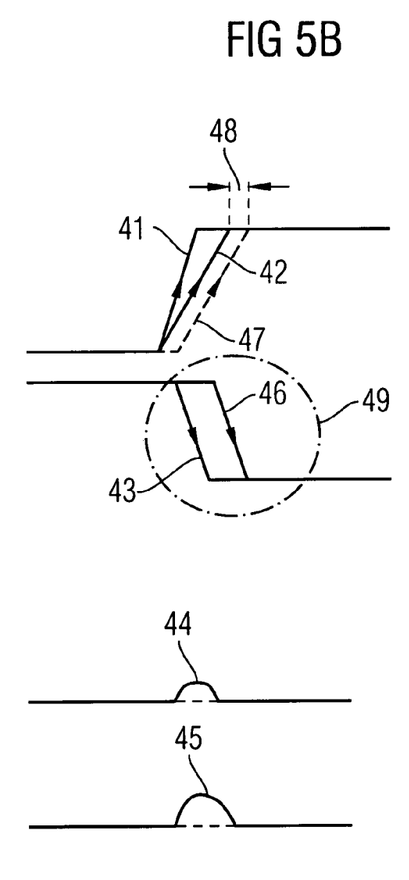
FIG. 5B illustrates example potential curves according to a memory device embodiment.

FIGS. 5A and 5B illustrate potential curves of virtual voltage supply line 4, bit line 6 and bit line precharging signal 20, wherein FIG. 5A illustrates potential curves of conventional memory devices and FIG. 5B illustrates potential curves of embodiments of a memory device. FIG. 5A has already been described above in the discussion of conventional memory devices in the Background Section. As illustrated by FIG. 5B, the potential curve of bit line precharging signal 20 depends on whether a short bit line 6 or virtual voltage supply line 4 (as indicated at 43) is present or whether a long bit line 6 or virtual voltage supply line 4 (as indicated at 46) is present by comparison as a result of which a self-correcting potential curve 49 of bit line precharging signal 20 is implemented. A potential curve of a virtual reference voltage supply line 3 delayed by a delay 48 is indicated at 47. Potential curves 44, 45 of a short bit line 6 and a long bit line 6 confirm, by comparison with corresponding potential curves 34, 35 according to conventional memory devices, that the memory device according to embodiments is able to keep a bit line 6 at $V_{SS}$ regardless of its length at the commencement of reading from a memory cell, because precharging device 15 or NFET transistor 2 can still completely clear the potential rise of bit line 6 caused by the potential change of virtual voltage supply line 4, as precharging device 15 or NFET transistor 2 is still activated for long enough.

Figure 6:
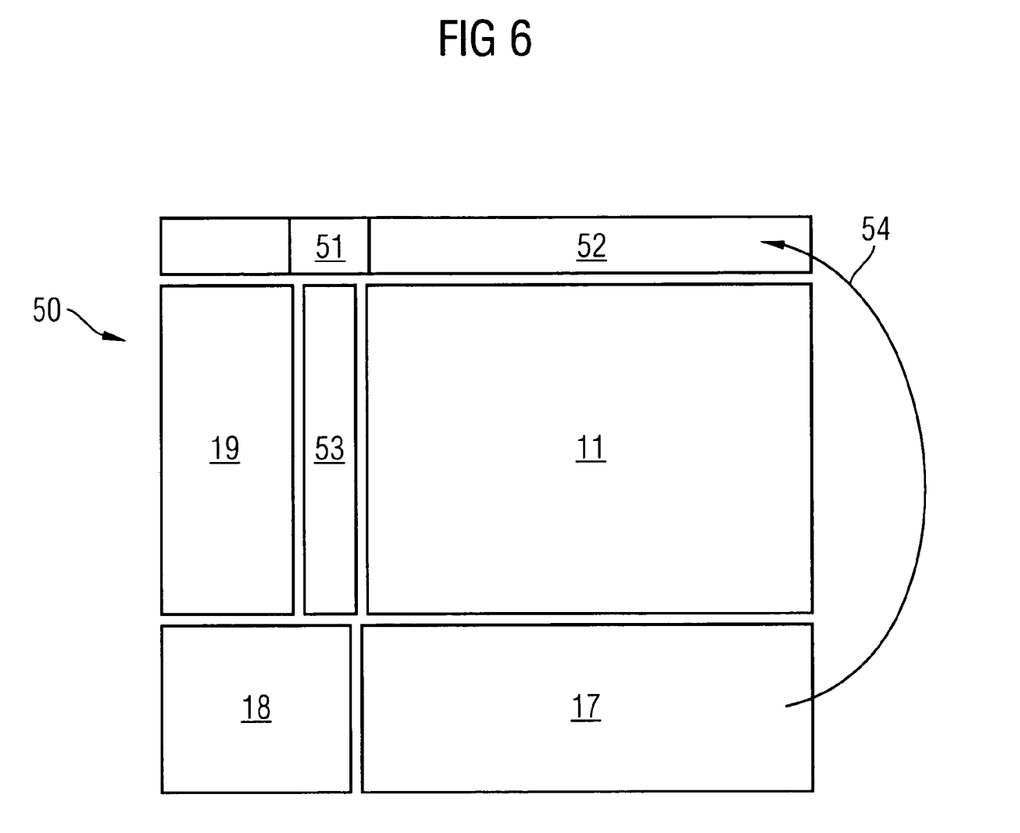
FIG. 6 illustrates one embodiment of an efficient surface assignment of a memory device in the layout of a semiconductor circuit.

FIG. 6 illustrates one embodiment of an area assignment in a layout of a memory device or in a ROM. In this embodiment, the layout includes a dummy discharging circuit 51, a bit line precharging circuit 52, a word line decoder 19, a dummy in respect of bit line and virtual voltage supply line 53, a ROM array 11, a control circuit 18 and a data path circuit 17. As the precharging devices for the bit lines are disposed at the opposite end of virtual voltage supply line 4 or at the opposite end of bit line 6 to the charging devices for virtual voltage supply lines 4, it is possible for bit line precharging circuit 52 to be disposed above ROM array 11 while data path circuit 17 (without bit line precharging circuit 52) is disposed underneath ROM array 11. As, according to conventional memory devices, dummy discharging circuit 51 is already disposed above ROM array 11, according to one embodiment, bit line precharging circuit 52 occupies a space that would otherwise remain empty. Therefore, in one embodiment relocation of bit line precharging circuit 52 above ROM array 11 does not increase the dimensions of the memory device in the Y direction whereas a reduction in size of data path circuit 17 due to relocation of bit line precharging circuit 52 leads to a reduction in the overall size of memory device 50. Alongside the reduction in size, according to one embodiment of data path circuit 17, shifting of bit line precharging circuit 52 out of data path circuit 17 also leads to an advantageous reduction in the complexity of the layout of data path circuit 17.

In one embodiment, reduction of the overall dimensions of memory device 50 leads additionally in an advantageous manner to shorter access times and cycle times such that relocation of bit line precharging circuit 52 out of data path circuit 17 leads to a faster memory device 50.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of supplying voltage to a bit line of a memory device, the method comprising:
precharging, with a precharging device, the bit line to an output potential;
deactivating the precharging device during a read action related to the bit line;
reading, during the read action, an information via the bit line; and
routing, during the read action, a virtual voltage supply line to a supply potential of the memory device to supply voltage to memory cells of the memory device assigned to the bit line, wherein the precharging device of the bit line is activated/deactivated as a function of the potential of the virtual voltage supply line.

2. The method according to claim 1, wherein the precharging device of the bit line is activated/deactivated as a function of an intensity of an electric coupling between the bit line and the virtual voltage supply line.

3. The method according to claim 1, wherein the precharging device of the bit line is not deactivated until a difference in amount between the supply potential and the potential of the virtual voltage supply line has dropped below a predetermined value.

4. The method according to claim 1, comprising:
routing, prior to the read action, a special virtual voltage supply line to the supply potential of the memory device, wherein the precharging device of the bit line is activated/deactivated as a function of the potential of the special virtual voltage supply line.

5. The method according to claim 4, wherein the precharging device of the bit line is not deactivated until both a difference in amount between the supply potential and the potential of the virtual voltage supply line has dropped below a first predetermined value and a difference in amount between the supply potential and the potential of the special virtual voltage supply line has dropped below a second predetermined value.

6. The method according to claim 4, wherein the precharging device of the bit line is not deactivated until a difference in amount between the supply potential and the potential of the virtual voltage supply line has dropped below a first predetermined value and a difference in amount between the supply potential and the potential of the special virtual voltage supply line has dropped below a second predetermined value for a duration of a predetermined time.

7. A memory device comprising:
a charging device;
a precharging device;
memory cells;
a plurality of bit lines;
a plurality of virtual voltage supply lines; and
a control device configured to coordinate a read action, during which an information is read via at least one of the bit lines, to actuate the charging device during the read action such that the charging device charges one of the virtual voltage supply lines to a voltage potential of the memory device to supply voltage to specific memory cells, to initially actuate the precharging device such that the precharging device brings the potential of one of the bit lines affected by the read action to an output potential of the memory device, and to subsequently deactivate the precharging device,
wherein the charging device and the precharging device are connected to different ends of a same virtual voltage supply line.

8. The memory device according to claim 7,
wherein the same virtual voltage supply line has a first end connected to an output of the charging device and a second end connected to a control input of the precharging device,
wherein the precharging device is configured to disconnect when a difference in amount between the supply potential and the potential of the virtual voltage supply line drops below a predetermined value, and
wherein a first connection of the precharging device is connected to the bit line and a second connection of the precharging device is connected to the output potential.

9. The memory device according to claim 8, wherein the precharging device comprises:
a transistor coupled, via a control input, to the virtual voltage supply line, such that the transistor disconnects when the difference in amount between the supply potential and the potential of the virtual voltage supply line drops below the predetermined value, wherein a first connection of the transistor is connected to the bit line and a second connection of the transistor is connected to the output potential.

10. The memory device according to claim 9,
wherein the precharging device comprises an inverter,
wherein the transistor is of the N-conduction type,
wherein the supply voltage potential is $V_{DD}$ and the output potential is $V_{SS}$, and
wherein the virtual voltage supply line is connected to an input of the inverter and an output of the inverter is connected to the control input of the transistor, and
wherein a source connection of the transistor is connected to $V_{SS}$ and a drain connection of the transistor is connected to the bit line.

11. The memory device according to claim 9,
wherein the precharging device comprises an inverter,
wherein the transistor is of the P-conduction type,
wherein the supply voltage potential is $V_{SS}$ and the output potential is $V_{DD}$,
wherein the virtual voltage supply line is connected to an input of the inverter and an output of the inverter is connected to the control input of the transistor, and
wherein a source connection of the transistor is connected to $V_{DD}$ and a drain connection of the transistor is connected to the bit line.

12. The memory device according to claim 7, comprising:
a special virtual voltage supply line, and
wherein the precharging device is configured to only disconnects when both a difference in amount between the supply potential and the potential of the virtual voltage supply line has dropped below a first predetermined value and when a difference in amount between the supply potential and the potential of the special virtual voltage supply line has dropped below a second predetermined value.

13. The memory device according to claim 12, comprising:
a special bit line, wherein a coupling capacity between the special virtual voltage supply line and the special bit line is at least as great as any possible coupling capacity between one of the bit lines and one of the virtual voltage supply lines, and wherein the special bit line is brought to the output potential by the precharging device prior to the read action and subsequently the special virtual voltage supply line is brought to the supply potential by the charging device during the read action.

14. The memory device according to claim 12,
wherein the precharging device comprises a NAND gate and a transistor,
wherein the transistor is of the N-conduction type,
wherein the supply voltage potential is $V_{DD}$ and the output potential is $V_{SS}$,
wherein the virtual voltage supply line is connected to a first input of the NAND gate, the special virtual voltage supply line is connected to a second input of the NAND gate, and an output of the NAND gate is connected to the control input of the transistor, and
wherein a source connection of the transistor is connected to $V_{SS}$ and a drain connection of the transistor is connected to the bit line.

15. The memory device according to claim 12,
wherein the precharging device comprises a NOR gate and a transistor,
wherein the transistor is of the P-conduction type,
wherein the supply voltage potential is $V_{SS}$ and the output potential is $V_{DD}$,
wherein the virtual voltage supply line is connected to a first input of the NOR gate, the special virtual voltage supply line is connected to a second input of the NOR gate, and an output of the NOR gate is connected to the control input of the transistor, and
wherein a source connection of the transistor is connected to $V_{DD}$ and a drain connection of the transistor is connected to the bit line.

16. The memory device according to claim 12, comprising:
a delay circuit, and
wherein the precharging device is configured to only disconnect when both the difference in amount between the supply potential and the potential of the virtual voltage supply line has dropped below the first predetermined value and the difference in amount between the supply potential and the potential of the special virtual voltage supply line has dropped below the second predetermined value for a period of time determined by the delay circuit.

17. The memory device according to claim 16, wherein the delay circuit is a programmable delay circuit.

18. A memory device comprising:
a charging device;
a precharging device;
memory cells;
a plurality of bit lines;
a plurality of virtual voltage supply lines; and
a control device configured to coordinate a read action, during which an information is read via at least one of the bit lines, and to actuate the charging device during the read action such that the charging device charges one of the virtual voltage supply lines to a voltage potential of the memory device,
wherein the precharging device is configured to bring the potential of one of the bit lines affected by the read action to an output potential of the memory device and is subsequently deactivated when a difference in amount between the supply potential and the potential of the virtual voltage supply line has dropped below a predetermined value.

19. The memory device according to claim 18, wherein the precharging device has a programmable variable for the current flow rate to make it possible to set a charging time for at least one of the bit lines.

20. The memory device according to claim 18, wherein a virtual voltage supply line and a precharging device is assigned to each bit line and a charging device is assigned to each virtual voltage supply line.

21. The memory device according to claim 18, wherein one of the bit lines in each case and one of the virtual voltage supply lines assigned to the one bit line run parallel.

22. A memory device comprising:
a charging device;
a precharging device;
memory cells;
a plurality of bit lines;
a plurality of virtual voltage supply lines;
a special virtual voltage supply line; and
a control device configured to coordinate a read action, during which an information is read out via at least one of the bit lines, and to actuate the charging device during the read operation such that the charging device charges one of the virtual voltage supply lines and the special virtual voltage supply line to a voltage potential of the memory device,
wherein the precharging device is configured to bring the potential of one of the bit lines affected by the read action to an output potential of the memory device and is subsequently deactivated when both a difference in amount between the supply potential and the potential of the virtual voltage supply line has dropped below a first predetermined value and when a difference in amount between the supply potential and the potential of the special virtual voltage supply line has dropped below a second predetermined value.

23. The memory device according to claim 22, comprising:
a special bit line, wherein a coupling capacity between the special virtual voltage supply line and the special bit line is at least as great as any possible coupling capacity between one of the bit lines and one of the virtual voltage supply lines, and wherein the special bit line is brought to the output potential by the precharging device prior to the read action and subsequently the special virtual voltage supply line is brought to the supply potential by the charging device during the read action.

24. The memory device according to claim 22, comprising:
a delay circuit,
wherein the precharging device is configured to only disconnects when both the difference in amount between the supply potential and the potential of the virtual voltage supply line has dropped below the first predetermined value and the difference in amount between the supply potential and the potential of the special virtual voltage supply line has dropped below the second predetermined value for a period of time determined by the delay circuit.

25. A memory device, comprising:
means for precharging a bit line to an output potential;
means for deactivating the means for precharging during a read action related to the bit line;
means for reading, during the read action, an information via the bit line; and
means for routing, during the read action, a virtual voltage supply line to a supply potential of the memory device to supply voltage to memory cells of the memory device assigned to the bit line, wherein the precharging device of the bit line is activated/deactivated as a function of the potential of the virtual voltage supply line.

* * * * *